United States Patent [19]

Walls et al.

[11] Patent Number: 5,368,974
[45] Date of Patent: Nov. 29, 1994

[54] LITHOGRAPHIC PRINTING PLATES HAVING A HYDROPHILIC BARRIER LAYER COMPRISED OF A COPOLYMER OF VINYLPHOSPHONIC ACID AND ACRYLAMIDE OVERLYING AN ALUMINUM SUPPORT

[75] Inventors: John E. Walls; Paul R. West, both of Fort Collins, Colo.

[73] Assignee: Eastman Kodak Company, Rochester, N.Y.

[21] Appl. No.: 67,459

[22] Filed: May 25, 1993

[51] Int. Cl.$^5$ ............... G03F 7/095; G03F 7/11
[52] U.S. Cl. ................... 430/156; 430/159; 430/160; 430/278; 430/302
[58] Field of Search ......... 430/278, 156, 302, 159, 430/160

[56] References Cited

U.S. PATENT DOCUMENTS

| 3,220,832 | 11/1965 | Uhlig . | |
|---|---|---|---|
| 4,153,461 | 5/1979 | Berghauser et al. . | |
| 4,376,814 | 3/1983 | Walls | 430/272 |
| 4,383,897 | 5/1983 | Gillich et al. | 204/33 |
| 4,399,021 | 8/1983 | Gillich et al. | 204/38 |
| 4,427,765 | 1/1984 | Mohr et al. | 430/525 |
| 4,448,647 | 5/1984 | Gillich et al. | 430/278 |
| 4,452,674 | 6/1984 | Gillich et al. | 430/278 |
| 4,458,005 | 7/1984 | Mohr et al. | 430/271 |
| 4,578,156 | 3/1986 | Plazter | 204/33 |
| 4,689,272 | 8/1987 | Simon et al. | 430/278 |

FOREIGN PATENT DOCUMENTS

86/0876  6/1986  South Africa .

*Primary Examiner*—Charles L. Bowers, Jr.
*Assistant Examiner*—Christopher G. Young
*Attorney, Agent, or Firm*—Alfred P. Lorenzo

[57] ABSTRACT

Improved lithographic printing plates are comprised of an aluminum support, a hydrophilic barrier layer comprised of a copolymer of about 40 to about 90 mole percent vinylphosphonic acid and about 10 to about 60 mole percent acrylamide overlying said support, and an image-forming layer capable of providing a lithographic printing surface overlying said barrier layer.

10 Claims, No Drawings

LITHOGRAPHIC PRINTING PLATES HAVING A HYDROPHILIC BARRIER LAYER COMPRISED OF A COPOLYMER OF VINYLPHOSPHONIC ACID AND ACRYLAMIDE OVERLYING AN ALUMINUM SUPPORT

FIELD OF THE INVENTION

This invention relates in general to the art of lithographic printing and in particular to lithographic printing plates having an aluminum support. More specifically, this invention relates to lithographic printing plates having a hydrophilic barrier layer interposed between the aluminum support and an image-forming layer which forms the lithographic printing surface.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink, while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

The type of lithographic printing plate to which the present invention is directed has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then comes more soluble and is removed. In the case of a negative plate, the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

One of the more serious problems which can afflict negative-working lithographic printing plates is inability of the developer to remove all residual coating from the non-image areas of the plate. When sufficient residual coating remains, a condition exists for background sensitivity to occur during the printing process. Minimally, the effect would be to increase the amount of water required in the fountain solution. Under more severe conditions, ink may adhere to the background and ultimately to the printed sheet, thereby resulting in a condition known as "tinting" or "toning." Under extremely severe conditions, there is so much ink in the background that it is referred to as "scumming."

In the manufacture of lithographic printing plates having an aluminum support, it is well known to provide a hydrophilic barrier layer interposed between the aluminum support and a radiation-sensitive layer which forms the lithographic printing surface. The barrier layer is utilized primarily to improve the hydrophilicity of the background areas and thereby minimize such problems as scumming. Many different materials have been proposed for use in forming such barrier layers. The barrier layer can be applied directly to the surface of the aluminum sheet material or the aluminum can be grained and/or anodized prior to application of the barrier layer. Illustrative of the many materials useful in forming such barrier layers are polyvinyl phosphonic acid, polyacrytic acid, polyacrylamide, silicates, zirconates and titanares. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 3,902,976, 4,090,880, 4,153,461, 4,376,814, 4,383,987, 4,399,021, 4,427,765, 4,427,766, 4,448,647, 4,452,674, 4,458,005, 4,492,616, 4,578,156, 4,689,272, 4,935,332 and European Patent No. 190 643.

Polymers containing phosphonic acid groups have been found to be especially beneficial in forming hydrophilic barrier layers, and use of such polymers has been described in at least the following references:

(1) Use of polyvinyl phosphonic acid, a copolymer of vinylphosphonic acid and acrylic acid or a copolymer of vinylphosphonic acid and vinyl acetate to treat aluminum which has not been anodized is proposed in U.S. Pat. No. 3,220,832. The process utilized is one which does not employ electric current.

(2) Use of polyvinyl phosphonic acid to treat anodized aluminum is proposed in U.S. Pat. No. 4,153,461. Again, the process utilized is one which does not employ electric current.

(3) Use of a mixture of polyvinyl phosphonic acid and sodium silicate to treat aluminum in either a thermal or electrochemical process is proposed in U.S. Pat. No. 4,376,814.

(4) Use of an electrolyte solution containing a water-soluble organic acid, such as polyvinyl phosphonic acid, and a phosphorus oxo acid to treat aluminum in an electrochemical process employing pulsed direct current is proposed in U.S. Pat. No. 4,383,897.

(5) Use of a water-soluble polybasic organic acid, such as polyvinyl phosphonic acid, to treat aluminum in an electrochemical process employing pulsed direct current is proposed in U.S. Pat. No. 4,399,021.

(6) Use of a reaction product of polyvinyl phosphonic acid and a salt of a divalent metal cation to treat aluminum, with or without an anodic coating of aluminum oxide, in a thermal process is proposed in U.S. Pat. No. 4,427,765.

(7) Use of an electrolyte solution containing a water-soluble organic acid, such as polyvinyl phosphonic acid, and a phosphorus oxo acid to treat aluminum in a direct current electrochemical process is proposed in U.S. Pat. No. 4,448,647.

(8) Use of a water-soluble polybasic organic acid, such as polyvinyl phosphonic acid, to treat aluminum in a direct current electrochemical process is proposed in U.S. Pat. No. 4,452,674.

(9) Use of polyvinyl methylphosphinic acid to treat anodized aluminum in a thermal process is proposed in U.S. Pat. No. 4,458,005.

(10) Use of a mixture of polyvinyl phosphonic acid and sufficient base to form an electrolyte with a pH of 3 to 10 to treat aluminum in an electrochemical process is proposed in U.S. Pat. No. 4,578,156.

(11) Use of polyvinyl phosphonic acid, a copolymer of vinylphosphonic acid and acrylic acid, a copolymer of vinylphosphonic acid and vinyl acetate or a copolymer of vinylphosphonic acid and acrylamide to treat anodized aluminum in a thermal process in which the aluminum oxide layer is treated with a silicate and then with a solution containing the polymer or copolymer is proposed in U.S. Pat. No. 4,689,272.

(12) Use of a homopolymer of acrylamide isobutylene phosphonic acid or a copolymer of acrylamide isobutylene phosphonic acid and acrylamide to treat aluminum, with or without an anodic coating of aluminum oxide, in a thermal or electrochemical process is proposed in South African Patent Specification No. 860,876.

While the hydrophilic barrier layers proposed heretofore are beneficial, there is a continuing need in the art for a more effective barrier layer which will render the treated surface both hydrophilic and stable and will provide excellent adhesion for subsequently applied negative-working or positive-working radiation-sensitive coatings.

Aluminum and aluminum oxide are neither oleophilic nor hydrophilic. They are referred to as amphipathic. Hence, the need for a barrier layer which will render the aluminum surface, and thus the background or non-image area of the printing plate, hydrophilic. The barrier layer not only provides a hydrophilic surface, but can also protect components of the radiation-sensitive layer, such as diazo resins, from undesirable interactions with the aluminum and can provide for improved adhesion of the radiation-sensitive layer. The barrier layer must provide a stable hydrophilic surface, since a major concern in the lithographic printing process is the ability of the background to remain clean by not being subject to oxidation or sensitization, and by not having ink-receptive material become part of the surface.

It is toward the objective of providing an improved barrier layer, that more effectively meets the needs of the lithographic printing industry, that the present invention is directed.

SUMMARY OF THE INVENTION

In accordance with this invention, a lithographic printing plate is comprised of an aluminum support, a hydrophilic barrier layer, and an image-forming layer that is capable of providing a lithographic printing surface. The hydrophilic barrier layer is in direct contact with the aluminum support and interposed between the aluminum support and the image-forming layer and is comprised of a copolymer of about 40 to about 90 mole % vinylphosphonic acid and about 10 to about 60 mole % acrylamide.

The hydrophilic barrier layer of this invention can be prepared by a thermal or electrochemical process, but optimum results are achieved with an electrochemical process. It is preferred, but not essential, that the aluminum support be provided with an aluminum oxide coating prior to application of the hydrophilic barrier layer, i.e., that the aluminum is anodized before the hydrophilic barrier layer is applied. Use of a silicate, either in the form of an underlayer as in U.S. Pat. No. 4,689,272 or in admixture with the polymer of vinylphosphonic acid, as in U.S. Pat. No. 4,376,814, is not necessary in the present invention.

As indicated by the prior art described hereinabove, it is well known to provide hydrophilic barrier layers in lithographic printing plates using thermal or electrochemical processes employing various polymers of vinylphosphonic acid. However, the formation, in accordance with the present invention, of a hydrophilic barrier layer comprised of a copolymer of vinylphosphonic acid and acrylamide and the many unexpected advantages provided thereby is not taught by the prior art.

The copolymer of vinylphosphonic acid and acrylamide utilized in this invention serves primarily to improve the hydrophilicity of the background area of the printing plate. It reduces the propensity toward scumming, allowing faster roll-up and generation of a good first print. It also improves the resistance of the background areas to chemical attack. The functions of the copolymer of vinylphosphonic acid and acrylamide are similar to those of the polyvinyl phosphonic acid of the prior art but its performance is unexpectedly superior and provides surprising beneficial advantages.

DESCRIPTION OF THE PREFERRED EMBODIMENTS

As indicated above, lithographic printing plates having an aluminum support and a hydrophilic barrier layer overlying the aluminum support are well known and widely used on a commercial basis. Such plates comprise at least one radiation-sensitive layer overlying the hydrophilic barrier layer. They can be either negative-working or positive-working.

The term "aluminum" as used herein is intended, as the context requires, to include both pure aluminum and aluminum alloys. Suitable alloys of aluminum include alloys containing minor amounts of any of silicon, iron, copper, manganese, magnesium, zinc, titanium, chromium, nickel and the like.

In the lithographic printing plates of this invention, the aluminum to which the hydrophilic barrier layer is applied can have a smooth surface, or the surface can have been grained by mechanical or electrochemical techniques, or it can have been anodized, or both grained and anodized. It is particularly preferred that the aluminum surface be both grained and anodized.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168, and 4,919,774.

Prior to electrolytic graining, the surface of the aluminum is cleaned to remove oil, dirt and grease therefrom. Suitable solvents and/or caustic solutions for carrying out such cleaning are well known in the art.

In an electrolytic graining process, the aluminum is treated, so as to increase its surface area and create a specific surface structure, by passing an electric current—usually an alternating electric current—from an electrode through an acid electrolyte to the aluminum. Typically, the aluminum that is conveyed through the electrolyte solution is in the form of a thin continuous web that may have a width of as much as two or more meters. It is desirable to grain the surface with a high efficiency in regard to both electric power and chemical consumption, while at the same time achieving proper grain morphology without excessive formation of adhering reaction by-products, commonly referred to as "smut". The presence of smut can necessitate an aggressive etch treatment, following the graining operation, which can further modify the surface in an unwanted manner. It is therefore highly desirable to operate the process in such a way that a minimal amount of smut is formed, and that which is formed is loosely bound and easily removed.

In carrying out electrolytic graining of aluminum, it is typical to utilize nitric or hydrochloric acid in admixture with the respective aluminum salt thereof. Other acids and many other types of chemical agents are also known for use in electrolytic graining baths. Electrodes, most commonly formed of graphite, are positioned to oppose the aluminum web at a distance ranging from about one-half centimeter to several centimeters. Either single phase or three phase alternating current is passed through the electrolyte so that at the interface between the solution and the aluminum, a displacement reaction occurs whereby aluminum is oxidized to form either the chloride or nitrate salt which is soluble in the solution. By removing aluminum with the use of an electric current, a specific surface structure is obtained. Parameters such as temperature, electrolyte concentration, flow rates and electrode spacing are important in determining the characteristics of the surface structure produced.

In the manufacture of the novel lithographic printing plates of this invention, it is especially preferred to utilize the two-stage electrolytic graining process described in U.S. Pat. Nos. 5,122,243 and 5,186,795. In this process, the aluminum is subjected to an electric current while immersed in an acidic electrolyte solution, such as a solution comprised of hydrochloric acid and aluminum chloride. Current density in the first stage of the process is at least as great and preferably substantially greater than in the second stage, while both treatment time and current consumption in the first stage are less than in the second stage. The process provides a fine uniform grain that is essentially free of pits.

Upon completion of graining, the aluminum can be subjected to an anodizing process utilizing an acid such as sulfuric and/or phosphoric acids. The anodization process serves to form an anodic oxide layer and is preferably controlled to create a layer of at least 0.3 g/m$^2$. Processes for anodizing aluminum and their use in the manufacture of lithographic printing plates are very well known and, accordingly, need not be further described herein.

A wide variety of radiation-sensitive materials suitable for forming images for use in the lithographic printing process are known. Any radiation-sensitive layer is suitable which, after exposure and any necessary developing and/or fixing, provides an area in imagewise distribution which can be used for printing.

Useful negative-working compositions include those containing diazo resins, photocrosslinkable polymers and photopolymerizable compositions. Useful positive-working compositions include aromatic diazo-oxide compounds such as benzoquinone diazides and naphthoquinone diazides.

Radiation-sensitive materials useful in lithographic printing plates include silver halide emulsions; quinone diazides (polymeric and nonpolymeric), as described in U.S. Pat. No. 4,141,733 (issued Feb. 27, 1979 to Guild) and references noted therein; light sensitive polycarbonates, as described in U.S. Pat. No. 3,511,611 (issued May 12, 1970 to Rannet et al) and references noted therein; diazonium salts, diazo resins, cinnamal-malonic acids and functional equivalents thereof and others described in U.S. Pat. No. 3,342,601 (issued Sep. 19, 1967) to Houle et al) and references noted therein; and light-sensitive polyesters, polycarbonates and polysulfonates as described in U.S. Pat. No. 4,139,390 (issued Feb. 13, 1979 to Rauner et al) and references noted therein.

A particularly important class of negative-working lithographic printing plates are those based on the use of diazo resins. The radiation-sensitive layer is typically comprised of the diazo resin, a polymeric binder and other ingredients such as colorants, stabilizers, exposure indicators, surfactants and the like. Particularly useful diazo resins include, for example, the condensation product of p-diazo diphenyl amine and paraformaldehyde, the condensation product of 3-methoxy-4-diazo diphenylamine and paraformaldehvde. and the diazo resins of U.S. Pat. No. 3,679,419, 3,849,392 and 3,867,147. Particularly useful polymeric binders for use with such diazo resins are acetal polymers as described, for example, in U.S. Pat. Nos. 4,652,604, 4,741,985 and 4,940,646.

In a preferred embodiment of this invention, the radiation-sensitive layer of the lithographic printing plate comprises a diazo resin and a binary acetal polymer as described in U.S. Pat. No. 5,169,897, issued Dec. 8, 1992. The binary acetal polymers of the '897 patent are comprised of recurring units which include two six-membered cyclic acetal groups, one of which is unsubstituted or substituted with an alkyl or hydroxylalkyl group, and the other of which is substituted with an aromatic or heterocyclic moiety.

In a further preferred embodiment of this invention, the radiation-sensitive layer of the lithographic printing plate comprises a diazo resin and an acid-substituted ternary acetal polymer as described in U.S. Pat. No. 5,169,898, issued Dec. 8, 1992. The acid-substituted ternary acetal polymers of the '898 patent are comprised of recurring units which include three six-membered cyclic acetal groups, one of which is unsubstituted or substituted with an alkyl or hydroxyalkyl group, another of which is substituted with an aromatic or heterocyclic moiety, and a third of which is substituted with an acid group, an acid-substituted alkyl group or an acid-substituted aryl group.

A second particularly important class of negative-working lithographic printing plates are those based on the use of radiation-sensitive photocrosslinkable polymers. Photocrosslinkable polymers which are particularly useful for this purpose are those containing the photosensitive group —CH=CH—CO— as an integral part of the polymer backbone, especially the p-phenylene diacrylate polyesters. These polymers are described, for example, in U.S. Pat. Nos. 3,030,208, 3,622,320, 3,702,765 and 3,929,489. A typical example of such a photocrosslinkable polymer is the polyester prepared from diethyl p-phenylenediacrylate and 14-bis(β-hydroxyethoxy)cyclohexane, which is comprised of recurring units of the formula:

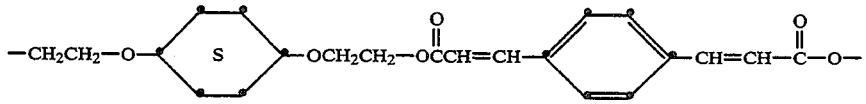

Other particularly useful polymers of this type are those which incorporate ionic moieties derived from monomers such as dimethyl-3,3'-[(sodioimino)disulfonyl]-dibenzoate and dimethyl-5-sodiosulfoisophthalate. Examples of such polymers include poly[1,4-cyclohexylene-bis(oxyethylene)-p-phenylenediacrylate]-co-3,3'-[(sodioimino)disulfonyl]dibenzoate and poly[1,4-cyclohexylene-bis(oxyethylene)-p-phenylenediacrylate]-co-3,3'-[(sodioimino)disulfonyl]dibenzoate-co-3-hydroxyisophathalate.

A third particularly important class of negative-working lithographic printing plates are the so-called "dual layer" plates. In this type of lithographic printing plate, a radiation-sensitive layer containing a diazo resin is coated over an anodized aluminum support and a radiation-sensitive layer containing a photocrosslinkable polymer is coated over the layer containing the diazo resin. Such dual layer plates are described, for example, in British Patent No. 1 274 017. They are advantageous in that radiation-sensitive layers containing diazo resins adhere much more strongly to most anodized aluminum supports than do radiation-sensitive layers containing photocrosslinkable polymers. Thus, the enhanced performance provided by photocrosslinkable polymers is achieved without sacrificing the excellent adhesive properties of diazo resin compositions.

In the lithographic printing plates of this invention, the hydrophilic barrier layer is formed from a copolymer of about 40 to about 90 mole % vinyl-phosphonic acid and about 10 to about 60 mole % acrylamide. Such copolymers have been found to be remarkably effective in either thermal or electrochemical treatment of aluminum surfaces. Optimum results are obtained with copolymers of 70 to 85 mole % vinylphosphonic acid and 15 to 30 mole % acrylamide.

A suitable method for preparing the copolymer is dropwise addition over a period of 2 to 3 hours of a solution of acrylamide and AIBN (azobisisobutyronitrile) in a suitable solvent to a solution of vinylphosphonic acid heated to about 80° C. The polymer precipitates from the reaction mixture as it is formed, and can be isolated as a fine white powder by suction filtration.

In the lithographic printing plates of this invention, the hydrophilic barrier layer comprised of the vinylphosphonic acid/acrylamide copolymer directly overlies the aluminum support, i.e., there is no layer of silicate or other material interposed between the aluminum support and the vinylphosphonic acid/acrylamide copolymer layer. In contrast, in U.S. Pat. No. 4,689,272, a silicate layer overlies the aluminum support and the layer of vinylphosphonic acid polymer overlies the silicate layer. Use of two layers in this manner results in a much more complex and costly process.

The aluminum surface which is coated with the barrier layer may be either mechanically or electrochemically grained, and may be anodized or non-anodized. The vinylphosphonic acid/acrytamide copolymer may be applied either thermally or electrochemically. In a thermal process, the aluminum is merely dipped in an aqueous solution of the vinylphosphonic acid/acrylamide copolymer to thereby form a thin hydrophilic barrier layer on the surface of the aluminum. In an electrochemical process, the aluminum is subjected to an electric current while immersed in an electrolyte solution containing the vinylphosphonic acid/acrylamide copolymer. In either instance, an aqueous solution containing from about 1 to about 5 grams per liter of the copolymer is suitable, and the temperature should be maintained at a level in excess of 80° C. For the thermal process, useful treatment times are at least about 5 seconds, more preferably at least about 10 seconds, and most preferably at least about 20 seconds. Treatment times of greater than 60 seconds offer no functional advantage over shorter treatment times. For the electrochemical process, direct current is preferred, although alternating current can be employed, if desired. Voltages as low as 5 volts direct current are useful. As the voltage is increased, the surface improves regarding both hydrophilicity and chemical etch. Voltages in excess of 150 volts direct current provide very hydrophilic surfaces, but these surfaces begin to exhibit diminishing adhesion to subsequently applied coatings. The preferred range is about 10 to about 120 volts direct current, and the most preferred range is about 20 to about 70 volts direct current. The time required for the electrochemical process is typically in the range of from about 5 to about 50 seconds, and preferably in the range of from about 10 to about 30 seconds.

The invention is further illustrated by the following examples of its practice.

PREPARATIVE EXAMPLE I

A 12-liter flask equipped with a condenser, mechanical stirrer and addition funnel was charged with 1.35 kg (12.5 moles) of vinylphosphonic acid having a purity of 90%. One liter (898 g) of ethyl acetame was added and the resulting solution was stirred under nitrogen and heated to a gentle reflux. Over a period of two hours, a solution of 222 g (3.12 moles) of acrylamide, 40 g (0.24 moles) of azobisisobutyronitrile and 3.5 liters (3143 g) of ethyl acetate was added to the reaction vessel via the addition funnel. As the acrylamide solution was added, a fine white precipitate was formed. Stirring and heating were continued for an additional three hours after completion of the addition of the acrylamide solution, and the reaction mixture was then cooled to room temperature and the precipitate collected using vacuum filtration. The product was washed with a liter of ethyl acetate and dried for 24 hours at 35° C. A yield of 1679 g was obtained. Elemental and NMR analysis of the very fine white powder confirmed the product as a copolymer of vinylphosphonic acid and acrylamide in approximately an 80:20 mole ratio.

PREPARATIVE EXAMPLE II

A 12-liter flask equipped with a condenser, mechanical stirrer and addition funnel was charged with 1.18 kg (10.93 moles) of vinylphosphonic acid having a purity of 90%. One liter (787 g) of acetonitrile was added and the resulting solution was stirred under nitrogen and heated to a gentle reflux. Over a period of two hours, a solution of 334 g (4.69 moles) of acrylamide, 50 g of t-butylperoctoate and 4.0 liters (3148) of acetonitrile was added to the reaction vessel via the addition funnel. As the acrylamide solution was added, a fine white precipitate was formed. Stirring and heating were continued for an additional three hours after completion of the addition of the acrylamide solution, and the reaction mixture was then cooled to room temperature and the precipitate collected using vacuum filtration. The product was washed with a liter of ethyl acetate and dried for 24 hours at 35° C. A yield of 1644 g was obtained. Elemental analysis of the very fine white powder confirmed the product as a copolymer of vinylphosphonic acid and acrylamide in approximately a 70:30 mole ratio.

PREPARATIVE EXAMPLE III

A 4-liter flask equipped with a condenser, mechanical stirrer and addition funnel was charged with 1 kg (9.2 moles) of vinylphosphonic acid having a purity of 90%. After adding 200 grams of water, the resulting solution was stirred under nitrogen and heated to 90° C. Over a period of four hours, a solution of 164.4 g (2.32 moles) of acrylamide, 28.8 g (21.2 mmoles) of 2,2'-azobis(2-amidinopropane)dihydrochloride and 200 grams of water was added to the reaction vessel, via the addition funnel, in eight equal portions at half-hour intervals. Stirring and heating was continued for an additional three hours after completion of the addition of the acrylamide solution, and the reaction mixture, a very viscous homogeneous solution of about 70% solids, was cooled to room temperature. Elemental analysis confirmed the product as a copolymer of vinylphosphonic acid and acrylamide in approximately an 80:20 mole ratio.

PREPARATIVE EXAMPLE IV

A 4-liter flask equipped with a condenser, mechanical stirrer and addition funnel was charged with 876 g (8.06 moles) of vinylphosphonic acid having a purity of 90%. After adding 200 grams of water, the resulting solution was stirred under nitrogen and heated to 90° C. Over a period of three hours, a solution of 245.2 g (3.46 moles) of acrylamide, 25 g (0.15 moles) of azobisisobutyronitrile and 400 g of methanol was added to the reaction vessel, via the addition funnel, in thirteen equal portions at 15-minute intervals. Stirring and heating were continued for an additional two hours after completion of the addition of the acrylamide solution, and the reaction mixture, a very viscous homogeneous solution of about 65% solids, was cooled to room temperature. Elemental analysis confirmed the product as a copolymer of vinylphosphonic acid and acrylamide in approximately a 70:30 mole ratio.

EXAMPLE 1

A 100-liter tank was filled to capacity with demineralized water and 200 grams of the vinylphosphonic acid/acrylamide copolymer prepared in accordance with Preparative Example I was added to the tank and mixed until dissolved. The solution was heated to 85° C.

An aluminum plate (36 cm×68 cm) was degreased in an aqueous alkaline preclean solution to remove mill oils, rinsed, neutralized and then subjected to electrolytic graining using AC current in an aqueous bath containing aluminum chloride and hydrochloric acid in a manner sufficient to produce a grained surface having an $R_a$ value of 0.32 (The $R_a$ value is defined in ANSI/ASME Standard B46.1- 1985. $R_a$, which is the roughness average and is also known as the center line arithmetic average, is the arithmetic average of the absolute values of the measured profile height deviations taken within the sampling length and measured from the graphical center line). After graining, the plate was rinsed and anodized in a bath comprising sulfuric acid in a manner sufficient to produce an oxide weight of 2.5 grams per square meter. Finally, the plate was rinsed and immersed in the hot bath containing the vinylphosphonic acid/acrylamide copolymer for 20 seconds. The plate was removed from the bath, washed for 30 seconds with dimineralized water and dried for 5 minutes at 60° C.

A radiation-sensitive coating composition as described in Example 3 of U.S. Pat. No. 5,169,898 was coated over the barrier layer containing the vinylphosphonic acid/acrylamide copolymer and the plate was exposed, developed, rinsed, finished and run on a Miehle single-color sheet-fed printing press equipped with a Dahlgren dampening system. The ink used was a process black, and the fountain solution (PRISCO Fountain Solution 2351 sold by Printer Service Corporation, Newark, N.J.) contained no isopropanol, but rather an alcohol substitute. The metering of the fountain solution to the plate was performed by a metering roll and was measured as a relative percent of the revolutions per minute (rpm). At 100%, the roll is delivering maximum solution to the plate, which for good printing would be too much water. However, some plate surfaces have a tendency to be sensitive and therefore require an increased water level. Without this adjustment, they would accept ink in the background and print a low density tint on the surface of the medium being printed. Conversely, a setting of 0% means the roll is not turning, and no fountain solution is being delivered to the plate. In such an instance, the plate would accept ink over the entire surface which results in scumming. The ideal and preferred situation is where the plate is run with the lowest water setting possible without printing an unwanted density in the background of the medium being printed. Such a condition permits higher ink laydown, better trapping, less bleeding of the ink, drier paper, less ink emulsification and an overall more balanced and constant printing environment.

The test was conducted by setting the metering roll at 56% and turning down the setting in two-unit increments, with 100 sheets being printed at each condition. This was continued until ink was observed printing in the background. The reading at first sensitivity was 32%. The motoring roll was stopped, at which point the plate rolls up solid with ink. The setting was returned to 56% and the metering roll was turned on. The number of sheets was counted until the plate provided acceptable prints without any background sensitivity. In this instance, six sheets were required. The test cycle was repeated again, whereby it was found that 32% is the point where the background becomes sensitive. Again, six sheets were required for acceptable print quality (density as measured with a densitometer ≦0.02 units).

The same substrate as described above was qualitatively evaluated by inking the uncoated substrate. The surface had ink applied over about a square decimeter without water, finisher or any other means of protection. The rate and ease of ink removal was noted when water was applied to the surface. Total removal of ink was observed to occur in 5–7 seconds.

EXAMPLE 2

In like manner as described in Example 1, a plate was prepared except that direct current voltage (VDC) was applied during formation of the barrier layer such that the plate being treated was made the anode and an opposing surface, installed at a distance of 10 cm, was made the cathode. A potential of 30 VDC was applied for 10 seconds. The treated plate was rinsed with demineralized water and dried for 5 minutes at 60° C. The plate was also evaluated as described in Example 1, whereby it was observed that a setting of 24% was required before background sensitivity became evident. Three sheets were required for the return to an acceptable print. The repeat again gave 24% before sensitivity occurred, and four sheets for an acceptable print. The dry ink test demonstrated total ink removal as soon as the water contacted the surface.

EXAMPLES 3–8

The following Table I summarizes the results obtained from the evaluation of copolymers, prepared in accordance with one or other of the preparative procedures described hereinabove, which are illustrative of the present invention. The mole ratios of vinylphosphonic acid to acrylamide were as specified in the table.

TABLE I

| Example No. | Preparative Procedure | Ratio* (VPA:AA) | VDC** | First Cycle % setting | First Cycle # sheets | Second Cycle % setting | Second Cycle # sheets | Dry Ink*** Type | Dry Ink*** Time |
|---|---|---|---|---|---|---|---|---|---|
| 3 | II | 60:40 | no | 34 | 7 | 34 | 8 | Total | 10 |
| 4 | III | 80:20 | yes | 26 | 4 | 28 | 4 | Total | 3 |
| 5 | IV | 70:30 | no | 28 | 5 | 28 | 7 | Total | 5 |
| 6 | I | 90:10 | no | 34 | 6 | 36 | 7 | Total | 6 |
| 7 | IV | 80:20 | yes | 24 | 3 | 24 | 4 | Total | 4 |
| 8 | III | 60:40 | yes | 26 | 5 | 26 | 6 | Total | 6 |

*VPA represents vinylphosphonic acid. AA represents acrylamide.
**VDC represents volts direct current. All evaluations were made at 30 VDC.
***The time in the dry ink test is the number of seconds required for the ink to be removed.

The data reported in Table I indicate that good results were obtained in each of examples 3 to 8 with minimum water settings ranging from 24 to 36% and acceptable prints being provided after 3 to 8 sheets.

The comparative examples which follow demonstrate the superior performance of the hydrophilic barrier layer of this invention in comparison with hydrophilic barrier layers heretofore employed.

COMPARATUVE EXAMPLE 1

This comparative example utilized a hydrophilic barrier layer prepared by a thermal process and composed of polyvinyl phosphonic acid as taught by U.S. Pat. No. 4,153,461.

A lithographic printing plate was prepared and evaluated in the same manner as in Example 1 except that polyvinyl phosphonic acid was used as the hydrophilic barrier layer in lieu of the copolymer of vinylphosphonic acid and acrylamide. In the first cycle, the fountain solution setting was reduced to a value of 40% before background sensitivity was observed. In the second cycle, after reduction to setting of 0% to create a solid roll-up the setting was reduced to 44% before background sensitivity was observed. The values of 40% and 44% obtained in this test are significantly higher than the value of 32% obtained in Example 1. The dry ink test indicated that the ink was fully removed after 12 seconds which is also inferior to the results obtained in Example 1.

COMPARATIVE EXAMPLE 2

This comparative example utilized a hydrophilic barrier layer prepared by an electrochemical process and composed of polyvinyl phosphonic acid as taught by U.S. Pat. No. 4,452,674.

A lithographic printing plate was prepared and evaluated in the same manner as described in Example 2 except that polyvinyl phosphonic acid was used as the hydrophilic barrier layer in lieu of the copolymer of vinylphosphonic acid and acrylamide. In the first cycle, the fountain solution setting was reduced to 36% before background sensitivity was observed. In the second cycle, after reduction to a setting of 0% to create a solid roll-up, the setting was reduced to 38% before background sensitivity was observed. The values of 36% and 38% obtained in this test are significantly higher than the value of 24% obtained in Example 2. The dry ink test indicated that the ink was fully removed after 9 seconds which is also inferior to the results obtained in Example 2.

COMPARATIVE EXAMPLE 3

This comparative example utilized a hydrophilic barrier layer prepared by a thermal process and composed of sodium silicate as taught by U.S. Pat. No. 2,714,066.

A lithographic printing plate was prepared and evaluated in the same manner as in Example 1 except that sodium silicate ($Na_2O$: $SiO_2$ ratio of 1:2.5) was used as the hydrophilic barrier layer in lieu of the copolymer of vinylphosphonic acid and acrylamide. In the first cycle, the fountain solution setting was reduced to a value of 48% before background sensitivity was observed. In the second cycle, after reducing to a setting of 0% to create a solid roll-up, the plate exhibited sensitivity at 56%. The setting had to be increased to 64% before the background was observed to print without tinting. The values of 48% and 64% obtained in this test are significantly higher than the value of 32% obtained in Example 1. The dry ink test indicated that the ink was fully removed after 20 seconds which is also inferior to the results obtained in Example 1.

COMPARATIVE EXAMPLE 4

This comparative example utilized a hydrophilic barrier layer prepared by an electrochemical process and composed of sodium silicate as taught by U.S. Pat. No. 3,902,976.

A lithographic printing plate was prepared and evaluated in the same manner as in Example 2 except that sodium silicate ($Na_2O:SiO_2$ ratio of 1:2.5) was used as the hydrophilic barrier layer in lieu of the copolymer of vinylphosphonic acid and acryiamide. In the first cycle, the fountain solution scenting was reduced to 38% before background sensitivity was observed. In the second cycle, after reduction to a setting of 0% to create a solid roll-up, the setting was reduced to 42% before background sensitivity was observed. The values of 38% and 42% obtained in this test are significantly higher than the value of 24% obtained in Example 2. The dry ink test indicated that the ink was fully removed after 12 seconds which is also inferior to the results obtained in Example 2.

The invention has been described in detail with particular reference to preferred embodiments thereof, but it will be understood that variations and modifications can be effected within the spirit and scope of the invention.

We claim:

1. A lithographic printing plate comprising:
    (1) an aluminum support;
    (2) a hydrophilic barrier layer; and
    (3) an image-forming layer that is capable of providing a lithographic printing surface; said hydrophilic barrier layer being in direct contact with said aluminum support and interposed between said aluminum support and said image-forming layer and being comprised of a copolymer of about 40 to about 90 mole percent vinylphosphonic acid and about 10 to about 60 mole percent acrylamide.

2. A lithographic printing plate as claimed in claim 1 wherein said aluminum support is comprised of grained and anodized aluminum.

3. A lithographic printing plate as claimed in claim 1 wherein said copolymer comprises 70 to 85 mole percent vinylphosphonic acid and 15 to 30 mole percent acrylamide.

4. A lithographic printing plate as claimed in claim 1 wherein said plate is negative-working.

5. A lithographic printing plate as claimed in claim 1 wherein said plate is positive-working.

6. A lithographic printing plate as claimed in claim 1 including a radiation-sensitive layer comprising a diazo resin and a polymeric binder.

7. A lithographic printing plate as claimed in claim 1 including a radiation-sensitive layer comprising a photocrosslinkable polymer.

8. A lithographic printing plate as claimed in claim 1 comprising a first radiation-sensitive layer comprising a diazo resin and a polymeric binder and a second radiation-sensitive layer comprising a photocrosslinkable polymer.

9. A method for the manufacture of a lithographic printing plate, which method comprises:
    providing an aluminum support material;
    forming on the surface of said aluminum support material a hydrophilic barrier layer comprising a copolymer of about 40 to about 90 mole percent vinylphosphonic acid and about 10 to about 60 mole percent acrylamide;
    and coating the surface of said hydrophilic barrier layer with a radiation-sensitive coating composition which is capable of forming a lithographic printing surface.

10. A method for the manufacture of a lithographic printing plate, which method comprises:
    providing a grained and anodized aluminum support material;
    forming on the grained and anodized surface of said aluminum support material by an electrochemical process a hydrophilic barrier layer comprising a copolymer of about 40 to about 90 mole percent vinylphosphonic acid and about 10 to about 60 mole percent acrylamide; and coating the surface of said hydrophilic barrier layer with a radiation-sensitive coating composition which is capable of forming a lithographic printing surface.

* * * * *